(12) United States Patent
Nishiyama

(10) Patent No.: US 11,527,674 B2
(45) Date of Patent: Dec. 13, 2022

(54) METHOD OF MANUFACTURING LIGHT-EMITTING DEVICE

(71) Applicant: NICHIA CORPORATION, Anan (JP)

(72) Inventor: Hirofumi Nishiyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 66 days.

(21) Appl. No.: 17/321,973

(22) Filed: May 17, 2021

(65) Prior Publication Data

US 2021/0367096 A1    Nov. 25, 2021

(30) Foreign Application Priority Data

May 20, 2020 (JP) .............................. JP2020-088131

(51) Int. Cl.
| | |
|---|---|
| *H01L 33/00* | (2010.01) |
| *H01L 33/38* | (2010.01) |
| *H01L 33/54* | (2010.01) |
| *H01L 33/50* | (2010.01) |
| *H01L 23/00* | (2006.01) |

(Continued)

(52) U.S. Cl.
CPC .......... *H01L 33/0095* (2013.01); *H01L 24/92* (2013.01); *H01L 24/94* (2013.01); *H01L 25/167* (2013.01); *H01L 33/007* (2013.01); *H01L 33/0093* (2020.05); *H01L 33/38* (2013.01); *H01L 33/507* (2013.01); *H01L 33/54* (2013.01); *H01L 24/24* (2013.01); *H01L 24/32* (2013.01); *H01L 33/32* (2013.01); *H01L 33/42* (2013.01); *H01L 2224/24146* (2013.01); *H01L 2224/32145* (2013.01); *H01L 2224/92244* (2013.01); *H01L 2924/12041* (2013.01); *H01L 2933/005* (2013.01); *H01L 2933/0016* (2013.01); *H01L 2933/0041* (2013.01)

(58) Field of Classification Search
CPC .................................................. H01L 33/0093
USPC ............................................................ 438/28
See application file for complete search history.

(56) References Cited

U.S. PATENT DOCUMENTS

| | | |
|---|---|---|
| 6,239,033 B1 | 5/2001 | Kawai |
| 2005/0104081 A1 | 5/2005 | Kim et al. |

(Continued)

FOREIGN PATENT DOCUMENTS

| | | |
|---|---|---|
| JP | H1145892 A | 2/1999 |
| JP | 2005-150675 A | 6/2005 |

(Continued)

*Primary Examiner* — Hsin Yi Hsieh
(74) *Attorney, Agent, or Firm* — Global IP Counselors, LLP

(57) ABSTRACT

A method includes: bonding a surface of a first wafer on a side having a semiconductor layer to a surface of a second wafer on a side having a first electrode to electrically connect the semiconductor layer and the first electrode; etching a silicon substrate such that a first portion of the silicon substrate remains in a region overlapping with the first electrode in a plan view; etching the semiconductor layer using the first portion as a mask such that a portion of the semiconductor layer between the first portion and the first electrode remains as at least one light-emitting portion; forming a resin layer to cover a lateral surface of the first portion and a lateral surface of the light-emitting portion with the resin layer; removing the first portion to expose the light-emitting portion; and forming a light-transmissive electrically conductive film on or above the light-emitting portion.

18 Claims, 24 Drawing Sheets

(51) Int. Cl.
    *H01L 25/16*     (2006.01)
    *H01L 33/32*     (2010.01)
    *H01L 33/42*     (2010.01)

(56) References Cited

U.S. PATENT DOCUMENTS

| | | |
|---|---|---|
| 2010/0051984 A1 | 3/2010 | West |
| 2019/0131343 A1 | 5/2019 | Templier et al. |
| 2019/0252312 A1* | 8/2019 | Yu .......................... H01L 24/05 |
| 2019/0385513 A1 | 12/2019 | Iguchi et al. |
| 2020/0273749 A1 | 8/2020 | Murano et al. |
| 2020/0335484 A1* | 10/2020 | Bono ................... H01L 25/167 |

FOREIGN PATENT DOCUMENTS

| | | | |
|---|---|---|---|
| JP | 2006-269716 | A | 10/2006 |
| JP | 2009-290232 | A | 12/2009 |
| JP | 2012-516026 | A | 7/2012 |
| JP | 2019-522894 | A | 8/2019 |
| JP | 2020-013809 | A | 1/2020 |
| JP | 2020-141001 | A | 9/2020 |
| WO | 2010027672 | A2 | 3/2010 |
| WO | 2018/116814 | A1 | 6/2018 |

\* cited by examiner

METHOD OF MANUFACTURING LIGHT-EMITTING DEVICE

CROSS-REFERENCE TO RELATED APPLICATION

This application claims priority to Japanese Patent Application No. 2020-088131 filed on May 20, 2020, the entire contents of which are hereby incorporated herein by reference.

BACKGROUND

1. Field of the Invention

The present disclosure relates to a method of manufacturing a light-emitting device.

2. Description of Related Art

For example, WO 2010/027672 describes a method of manufacturing a light source including a step of bonding a plurality of light-emitting semiconductor dies to electrical traces of a substrate.

SUMMARY

In the case in which a plurality of light-emitting elements are mounted on a circuit board one by one to manufacture a light-emitting device, the light-emitting elements are likely to be misaligned.

An object of certain embodiments of the present invention is to provide a method of manufacturing a light-emitting device, the method allowing for improving accuracy in positioning of a light-emitting portion.

A method of manufacturing a light-emitting device according to an embodiment of the present invention includes: providing a first wafer, the first wafer including a silicon substrate and a semiconductor layer disposed on the silicon substrate, the semiconductor layer including a light-emitting layer; providing a second wafer, the second wafer including a substrate and a first electrode on or above the substrate; bonding a surface of the first wafer on a side having the semiconductor layer to a surface of the second wafer on a side having the first electrode to electrically connect the semiconductor layer and the first electrode; etching the silicon substrate such that at least one first portion of the silicon substrate remains in a region overlapping with the first electrode in a plan view; etching the semiconductor layer using the at least one first portion of the silicon substrate as a mask such that at least one portion of the semiconductor layer between the at least one first portion of the silicon substrate and the first electrode of the second wafer remains as at least one light-emitting portion; forming a resin layer to cover a lateral surface of the at least one first portion of the silicon substrate and a lateral surface of the at least one light-emitting portion with the resin layer; removing the at least one first portion of the silicon substrate to expose the at least one light-emitting portion; and after the exposing of the at least one light-emitting portion, forming a light-transmissive electrically conductive film on or above the at least one light-emitting portion.

With the method of manufacturing a light-emitting device according to one embodiment of the present invention, accuracy in position of the light-emitting portion can be improved.

BRIEF DESCRIPTION OF THE DRAWINGS

FIG. 12 is a schematic cross-sectional view illustrating a step in the method of manufacturing a light-emitting device of the embodiment of the present invention.

FIG. 23 is a schematic cross-sectional view illustrating a step in the modified method of manufacturing a light-emitting device of the embodiment of the present invention.

DETAILED DESCRIPTION

Figure 1:
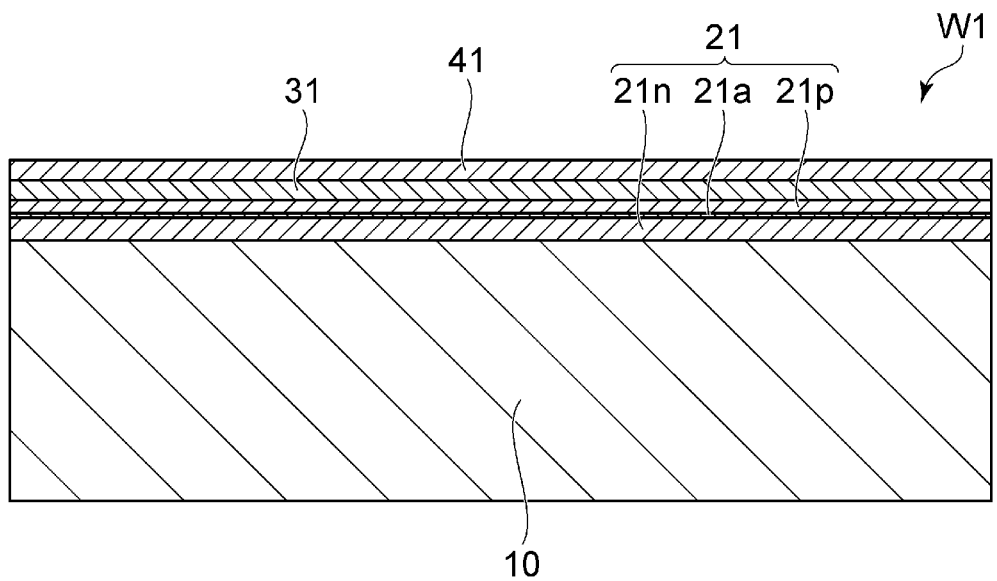
FIG. 1 is a schematic cross-sectional view illustrating a step in a method of manufacturing a light-emitting device of an embodiment of the present invention.

Certain embodiments of the present invention will be described below referring to the accompanying drawings. In the drawings, the same reference numeral is applied to the same component.

A method of manufacturing a light-emitting device according to one embodiment of the present invention will be described below referring to FIG. 1 to FIG. 17.

Figure 2:
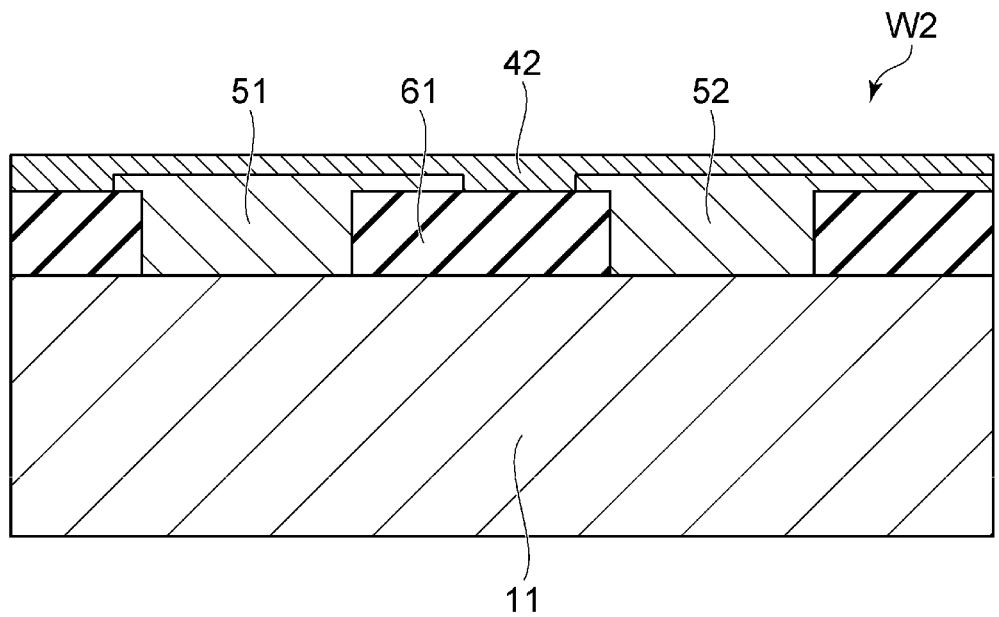
FIG. 2 is a schematic cross-sectional view illustrating a step in the method of manufacturing a light-emitting device of the embodiment of the present invention.

The method of manufacturing a light-emitting device according to one embodiment of the present invention includes providing a first wafer W1 shown in FIG. 1 and providing a second wafer W2 shown in FIG. 2.

The first wafer W1 includes a silicon substrate 10, a semiconductor layer 21, a contact layer 31, and a first bonding layer 41 as shown in FIG. 1.

The semiconductor layer 21 contains, for example, a nitride semiconductor. The term "nitride semiconductor" as used in the present specification includes all semiconductors having compositions with composition ratios x and y varying in the respective ranges in the chemical formula represented by $In_xAl_yGa_{1-x-y}N$ (where $0 \leq x \leq 1$, $0 \leq y \leq 1$, and $x+y \leq 1$). The term "nitride semiconductor" further includes semiconductors further containing various elements added in order to control various physical properties such as the electrical conductivity type.

The semiconductor layer 21 includes a first semiconductor layer 21n, a second semiconductor layer 21p, and a light-emitting layer 21a between the first semiconductor layer 21n and the second semiconductor layer 21p. For example, the first semiconductor layer 21n is of the n-type, and the second semiconductor layer 21p is of the p-type. The first semiconductor layer 21n, the light-emitting layer 21a, and the second semiconductor layer 21p are grown on the silicon substrate 10 in order by, for example, metal organic chemical vapor deposition (MOCVD).

The contact layer 31 is formed on the semiconductor layer 21. The contact layer 31 is, for example, an indium tin oxide (ITO) layer. The first bonding layer 41 is formed on the contact layer 31. The first bonding layer 41 is, for example, a metal layer. The first bonding layer 41 is formed on an entirety of a surface of the first wafer W1 on a side having the semiconductor layer 21.

The contact layer 31 and the first bonding layer 41 have electrical conductivity. Depending on a material of the first bonding layer 41, the first bonding layer 41 may be formed in contact with the semiconductor layer 21 without forming the contact layer 31.

The second wafer W2 includes a substrate 11, a first electrode 51, and a second electrode 52 as shown in FIG. 2. For example, the substrate 11 is a circuit board having a structure in which a transistor is formed on a silicon substrate. The second wafer W2 may not include the second electrode 52.

The first electrode 51 and the second electrode 52 are disposed on the substrate 11 to be apart from each other. Each of the first electrode 51 and the second electrode 52 extends in, for example, a direction perpendicular to a plane shown in FIG. 2. An insulating film 61 is disposed between the first electrode 51 and the second electrode 52 on the substrate 11. The first electrode 51 and the second electrode 52 are, for example, metal electrodes.

A second bonding layer 42 is disposed on the insulating film 61 to cover the first electrode 51 and the second electrode 52. The second bonding layer 42 is, for example, a metal layer. The second bonding layer 42 is disposed on a surface of the second wafer W2 on a side having the first electrode 51 and the second electrode 52.

Figure 3:
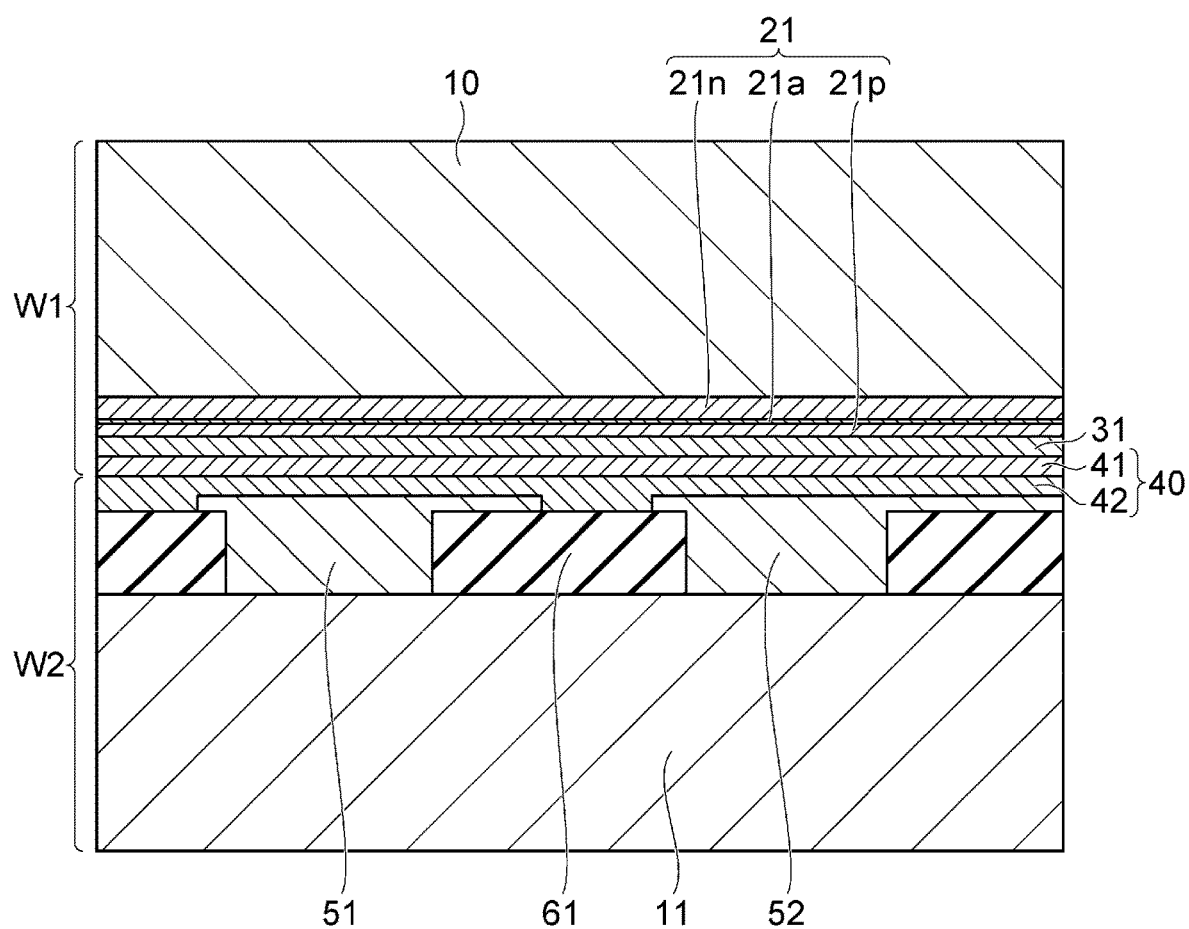
FIG. 3 is a schematic cross-sectional view illustrating a step in the method of manufacturing a light-emitting device of the embodiment of the present invention.

After the first wafer W1 and the second wafer W2 are provided, a surface of the first wafer W1 on the side having the semiconductor layer 21 is bonded to a surface of the second wafer W2 on the side having the first electrode 51 and the second electrode 52 as shown in FIG. 3. The surface of the first wafer W1 on a side having the semiconductor layer 21 can be bonded to the surface of the second wafer W2 on a side having the first electrode 51 and the second electrode 52 by, for example, direct bonding such as surface-activated bonding or atomic diffusion bonding.

The first bonding layer 41 is formed on the surface of the first wafer W1 on a side having the semiconductor layer 21, and the second bonding layer 42 is formed on the surface of the second wafer W2 on a side having the first electrode 51 and the second electrode 52. Accordingly, the first wafer W1 and the second wafer W2 are bonded together by bonding the first bonding layer 41 and the second bonding layer 42. As long as the first wafer W1 and the second wafer W2 can be bonded together, either the first bonding layer 41 or the second bonding layer 42 may not be formed.

The first bonding layer 41 and the second bonding layer 42 are bonded to be integrated to be an electrically conductive bonding layer 40, and the electrically conductive bonding layer 40 is disposed between the semiconductor layer 21 and the first electrode 51 and between the semiconductor layer 21 and the second electrode 52. The semiconductor layer 21 is electrically connected to the first electrode 51 and the second electrode 52 via the contact layer 31 and the bonding layer 40.

After the first wafer W1 and the second wafer W2 are bonded together, a thickness of the silicon substrate 10 of the first wafer W1 is reduced. The silicon substrate 10 is reduced in thickness such that the silicon substrate 10 has a thickness of, for example, about 20 μm. For example, the thickness of the silicon substrate 10 can be reduced by grinding. Reduction in thickness of the silicon substrate 10 allows for reducing the etching time of the silicon substrate 10 in etching of the silicon substrate 10 that will be described below.

Figure 4:
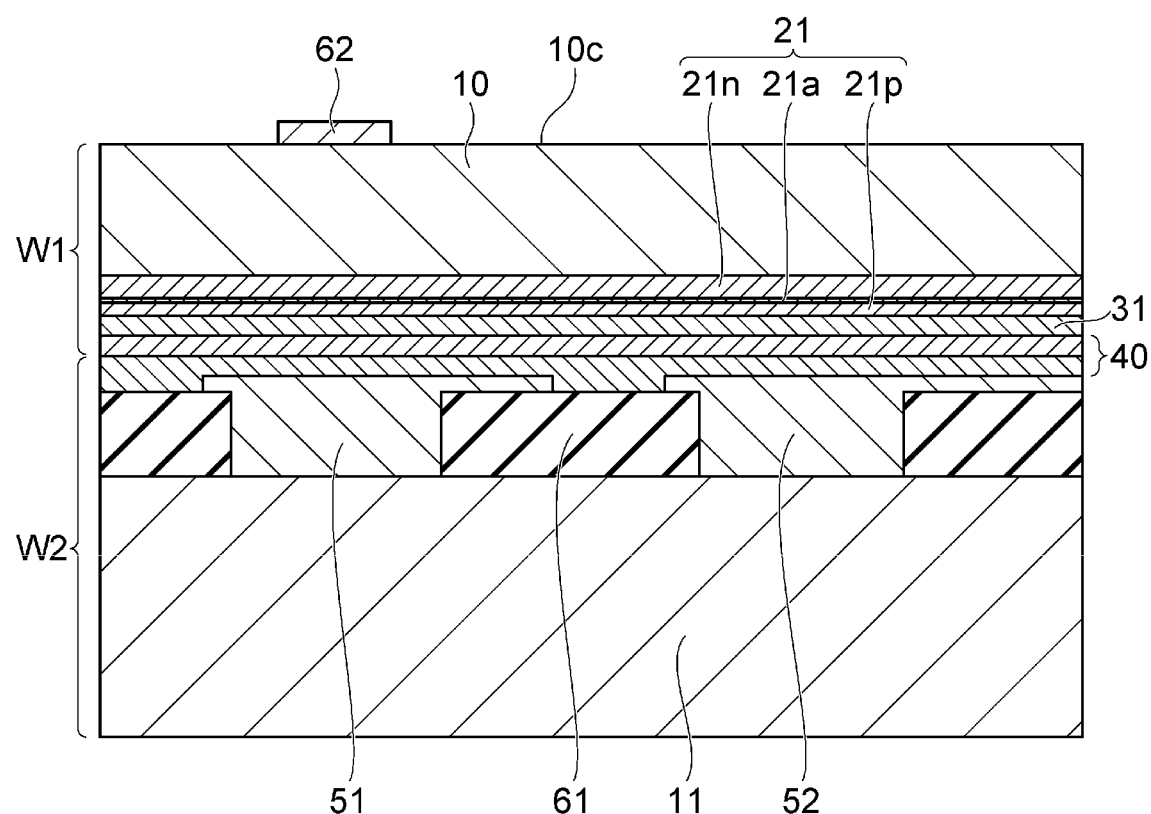
FIG. 4 is a schematic cross-sectional view illustrating a step in the method of manufacturing a light-emitting device of the embodiment of the present invention.

After the thickness of the silicon substrate 10 is reduced, a resist 62 is selectively disposed on a surface 10c, which is a surface of the silicon substrate 10 opposite to the surface of the silicon substrate 10 on a side having the semiconductor layer 21, as shown in FIG. 4. The resist 62 is located in a region on the first wafer W1 overlapping with the first electrode 51 in a plan view.

The silicon substrate 10 is etched using the resist 62 as the mask. For example, the silicon substrate 10 is etched by reactive ion etching (RIE) using a fluorine-containing gas. As described above, reducing the thickness of the silicon substrate 10 before the silicon substrate 10 is etched allows for reducing the etching time of the silicon substrate 10. Reducing the thickness of the silicon substrate 10 allows for improving the accuracy of patterning of the resist 62, so that accuracy of patterning of the silicon substrate 10 can be improved.

Figure 5:
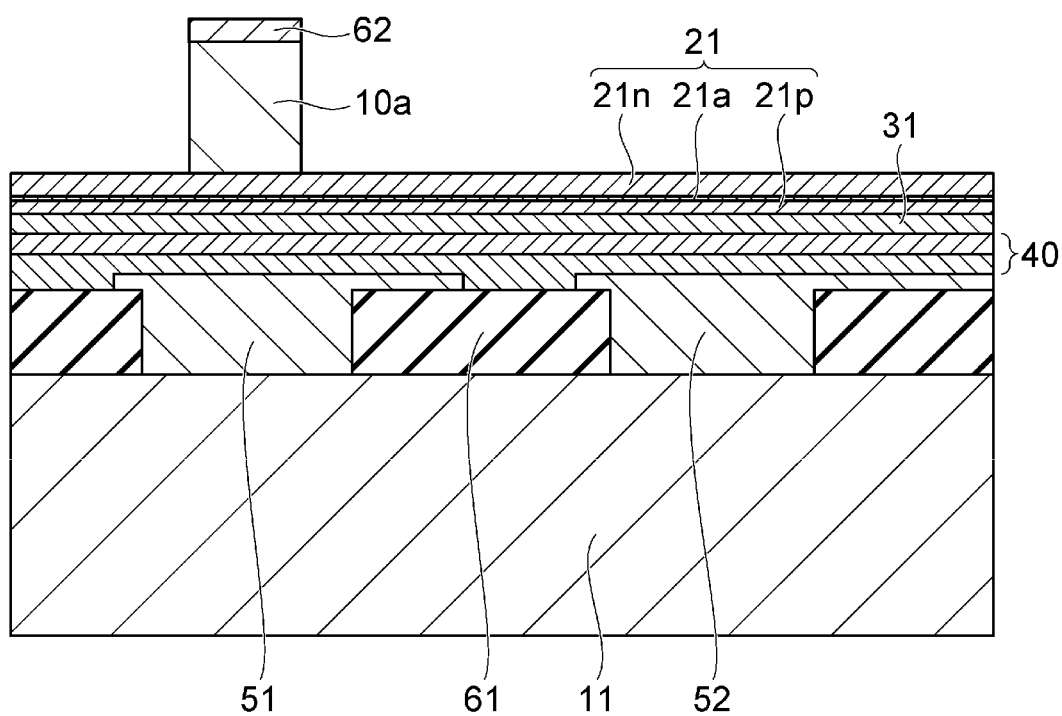
FIG. 5 is a schematic cross-sectional view illustrating a step in the method of manufacturing a light-emitting device of the embodiment of the present invention.

Through the step of etching the silicon substrate 10, a first portion 10a of the silicon substrate 10 under the resist 62 is left (remains) in a columnar shape on the semiconductor layer 21 as shown in FIG. 5.

Figure 6:
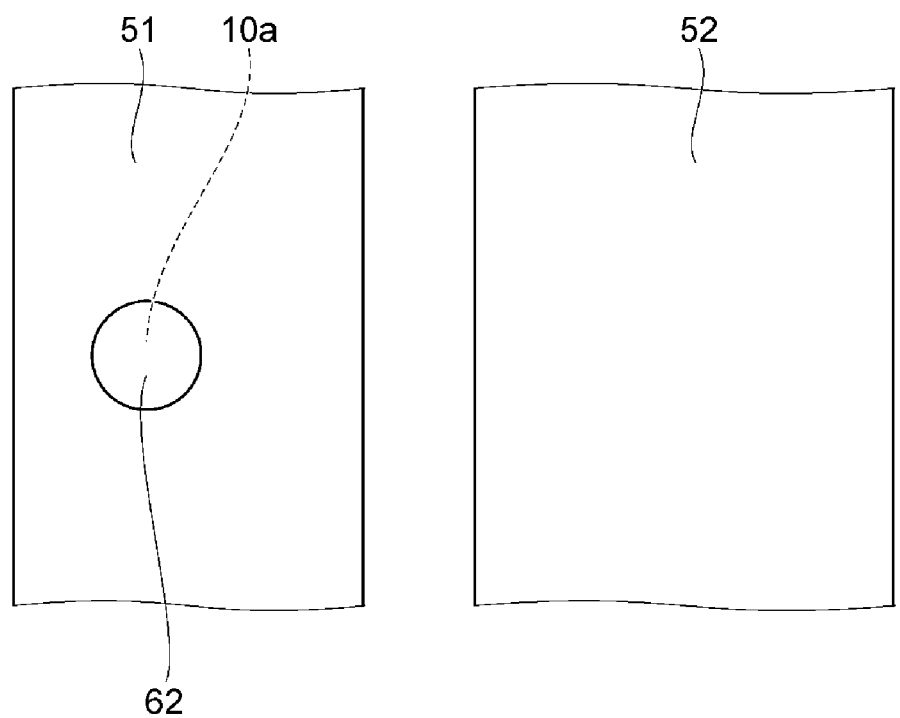
FIG. 6 is a schematic plan view illustrating positional relationships between main components in the light-emitting device of the embodiment of the present invention.

FIG. 6 is a schematic plan view illustrating positional relationships between the resist 62, the first portion 10a, the first electrode 51, and the second electrode 52 shown in FIG. 5. In order to facilitate understanding of positional relationships between the first portion 10a, the first electrode 51, and the second electrode 52, illustrations of the other members are omitted in FIG. 6. In the schematic plan view of FIG. 6, the first portion 10a is located in a region overlapping with the first electrode 51 under the resist 62.

FIG. 6 shows an example in which the resist 62 and the first portion 10a have circular shapes in a plan view, but the resist 62 and the first portion 10a may have elliptic or polygonal shapes in a plan view.

After the silicon substrate is removed such that the first portion 10a of the silicon substrate 10 is left, the semiconductor layer 21 is etched using the first portion 10a of the silicon substrate 10 as the mask. For example, the semiconductor layer 21 is etched by RIE using a chlorine-containing gas.

Figure 7:
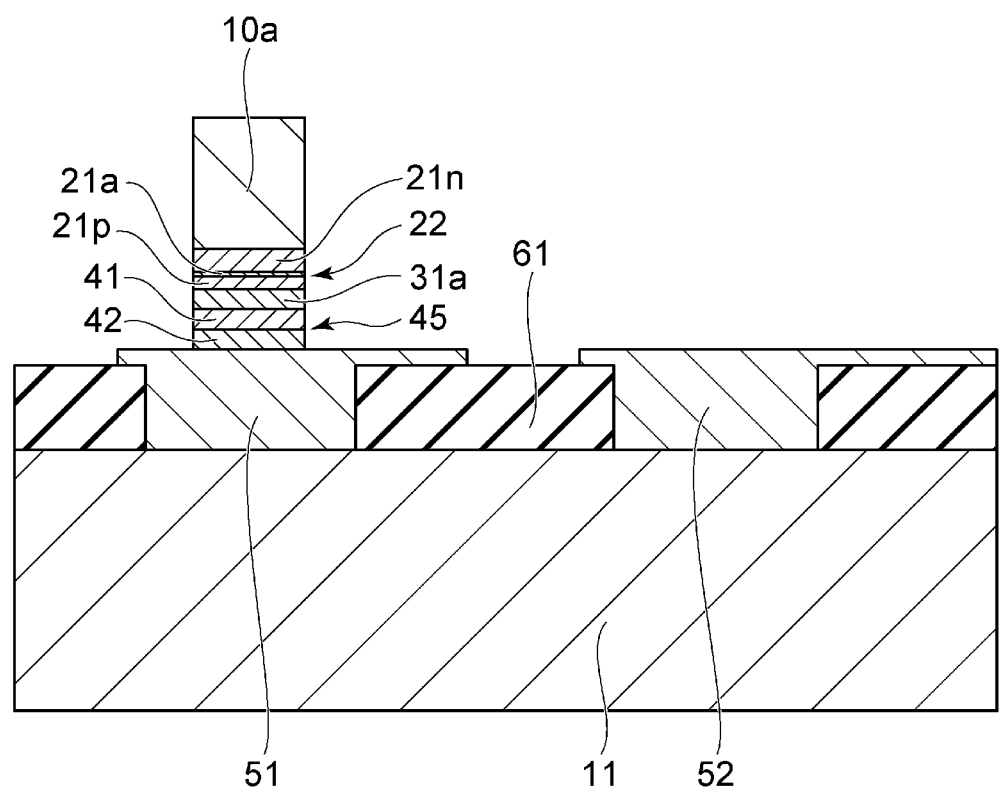
FIG. 7 is a schematic cross-sectional view illustrating a step in the method of manufacturing a light-emitting device of the embodiment of the present invention.

Through the step of etching the semiconductor layer 21, a portion of the semiconductor layer 21 is left between the first portion 10a and the first electrode 51 to serve as a light-emitting portion 22 as shown in FIG. 7. The light-emitting portion 22 includes the n-type first semiconductor layer 21n, the p-type second semiconductor layer 21p, and the light-emitting layer 21a between the first semiconductor layer 21n and the second semiconductor layer 21p.

Figure 8:
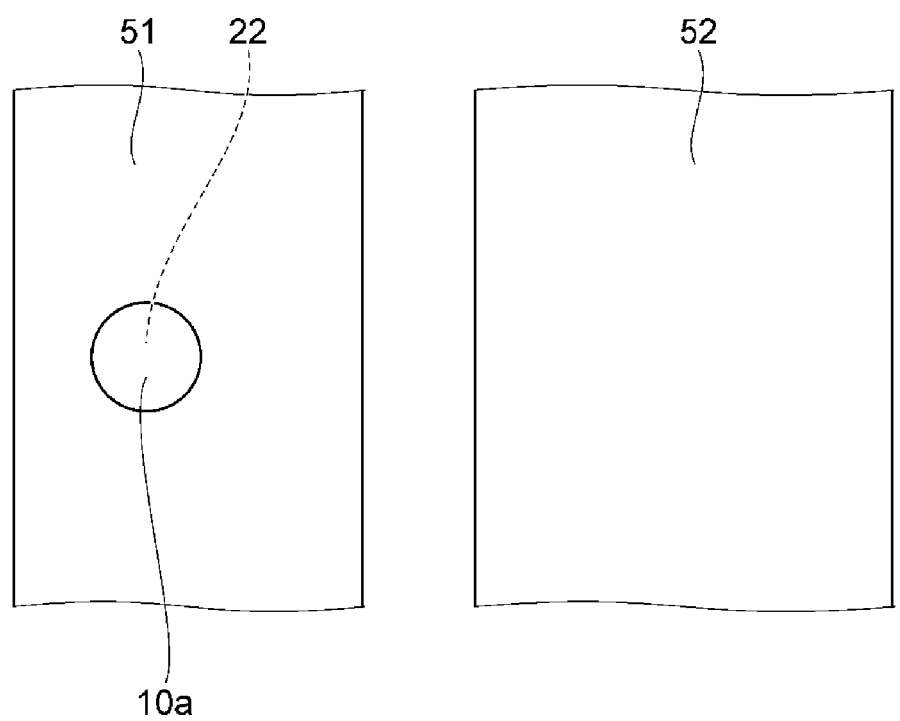
FIG. 8 is a schematic plan view illustrating positional relationships between main components in the light-emitting device of the embodiment of the present invention.

FIG. 8 is a schematic plan view illustrating positional relationships between the first portion 10a, the light-emitting portion 22, the first electrode 51, and the second electrode 52 shown in FIG. 7. In order to facilitate understanding of positional relationships between the first portion 10a, the light-emitting portion 22, the first electrode 51, and the second electrode 52, illustration of the other members are omitted in FIG. 8. In the schematic plan view of FIG. 8, the light-emitting portion 22 is located in a region overlapping with the first electrode 51 under the first portion 10a.

FIG. 8 shows an example in which the light-emitting portion 22 has a circular shape in a plan view, but the light-emitting portion 22 may have an elliptic or polygonal shape in a plan view. The light-emitting portion 22 has a size (such as the diameter) of, for example, 5 μm or more and 1,000 μm or less in a plan view.

After the step of leaving a portion of the semiconductor layer 21 as the light-emitting portion 22, the contact layer 31 and the bonding layer 40 are etched using the first portion 10a as a mask. Subsequently to the etching of the semiconductor layer 21, the contact layer 31 and the bonding layer 40 are etched by, for example, RIE using the same chlorine-containing gas.

Through the step of etching the contact layer 31 and the bonding layer 40, a portion of the contact layer 31 and a portion of the bonding layer 40 are left between the light-emitting portion 22 and the first electrode 51 to serve as a contact portion 31a and a bonding portion 45, respectively, as shown in FIG. 7. The light-emitting portion 22 is electrically connected to the first electrode 51 via the contact portion 31a and the bonding portion 45.

Figure 9:
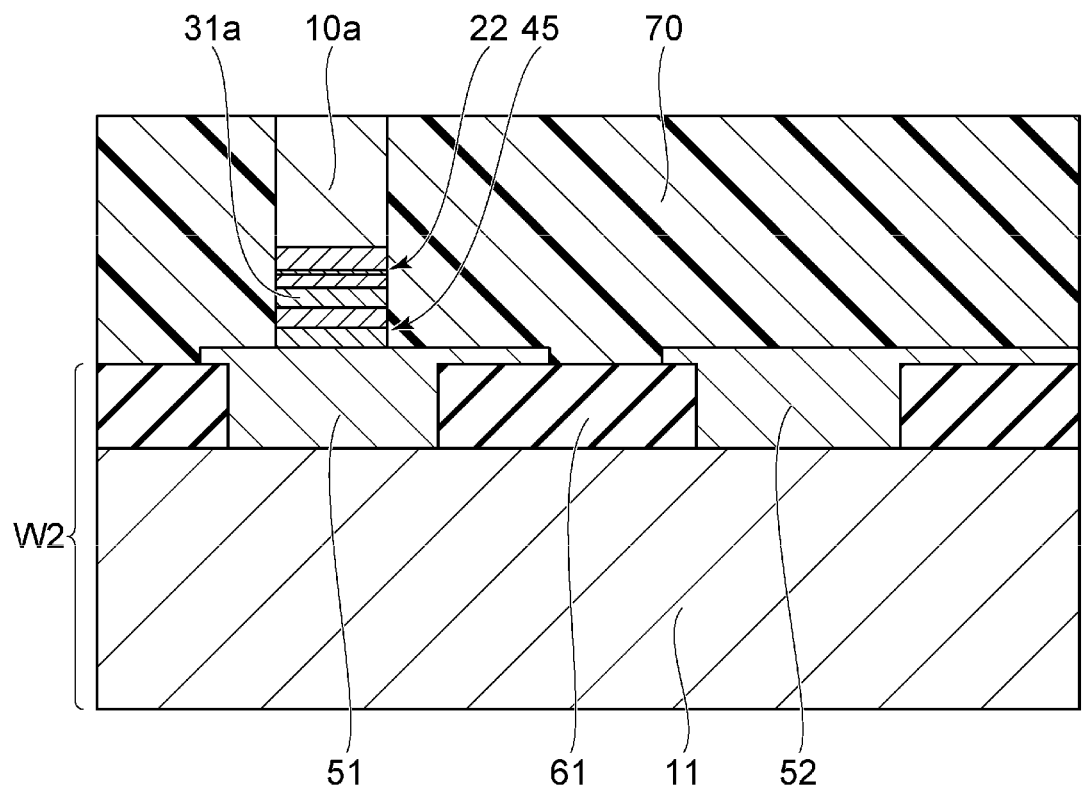
FIG. 9 is a schematic cross-sectional view illustrating a step in the method of manufacturing a light-emitting device of the embodiment of the present invention.

After that, a resin layer 70 is formed on the second wafer W2 as shown in FIG. 9. The resin layer 70 covers the first electrode 51 and the second electrode 52. The resin layer 70 also covers a lateral surface of the first portion 10a of the silicon substrate 10, a lateral surface of the light-emitting portion 22, a lateral surface of the contact portion 31a, and a lateral surface of the bonding portion 45. Examples of the resin layer 70 include epoxy resins and silicone resins. The resin layer 70 may contain, for example, a white pigment. When the resin layer 70 contains a white pigment, light emitted from the light-emitting portion 22 can be efficiently extracted to the outside. The resin layer 70 containing the white pigment has a reflectance at a peak wavelength of light emitted from the light-emitting portion 22 of preferably 70% or more, more preferably 80% or more, even more preferably 90% or more.

The resin layer 70 is disposed to cover the upper surface of the first portion 10a, and is then ground. This grinding exposes the upper surface of the first portion 10a from the resin layer 70 as shown in FIG. 9.

After the upper surface of the first portion 10a is exposed, the first portion 10a is removed. The first portion 10a is removed by, for example, etching in an RIE technique using a fluorine-containing gas. Using an etching method with which the etch rate in the first portion 10a is higher than the etch rate in the resin layer 70 allows for removing the first portion 10a without greatly changing the thickness of the resin layer 70.

Figure 10:
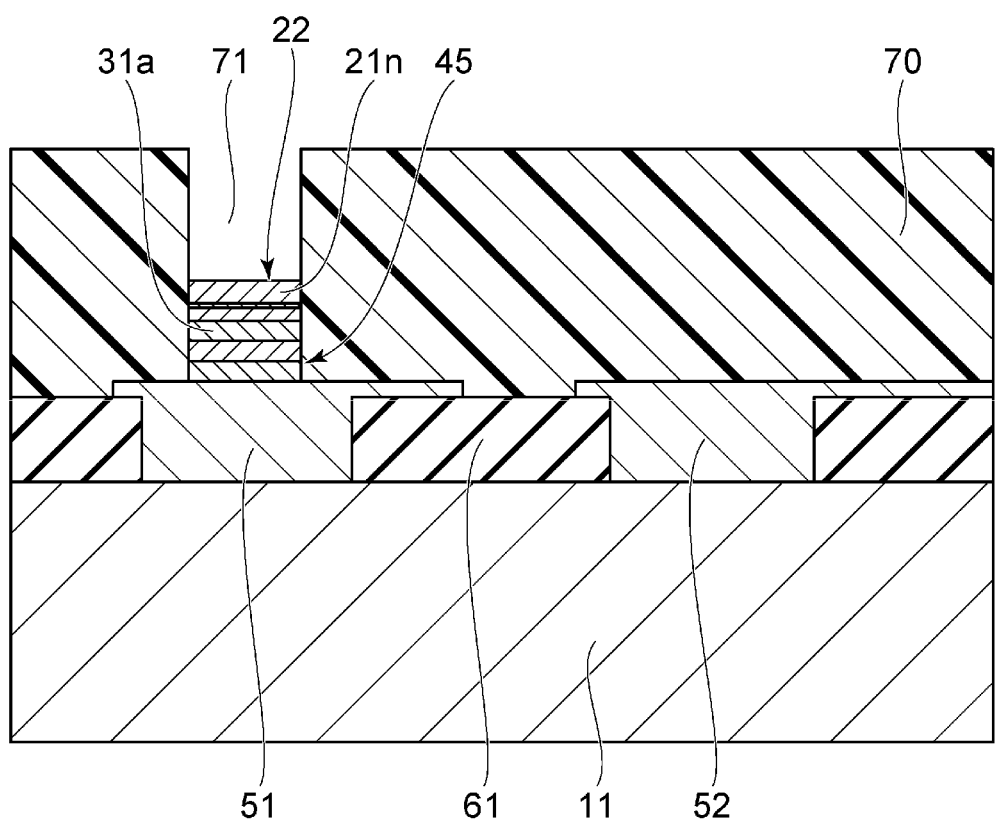
FIG. 10 is a schematic cross-sectional view illustrating a step in the method of manufacturing a light-emitting device of the embodiment of the present invention.

Through the step of removing the first portion 10a, a recess 71 is defined on the light-emitting portion 22 in the resin layer 70 as shown in FIG. 10. The light-emitting portion 22 is exposed from the resin layer 70 through the recess 71. The upper surface of the first semiconductor layer 21n in the light-emitting portion 22 defines the bottom of the recess 71.

Figure 11:
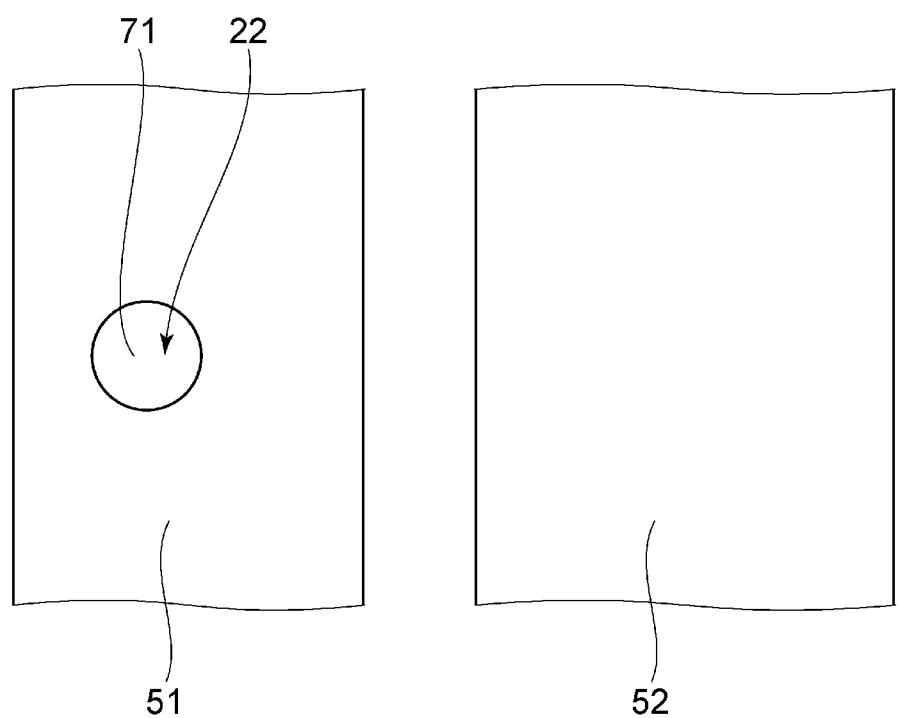
FIG. 11 is a schematic plan view illustrating positional relationships between main components in the light-emitting device of the embodiment of the present invention.
Figure 1:
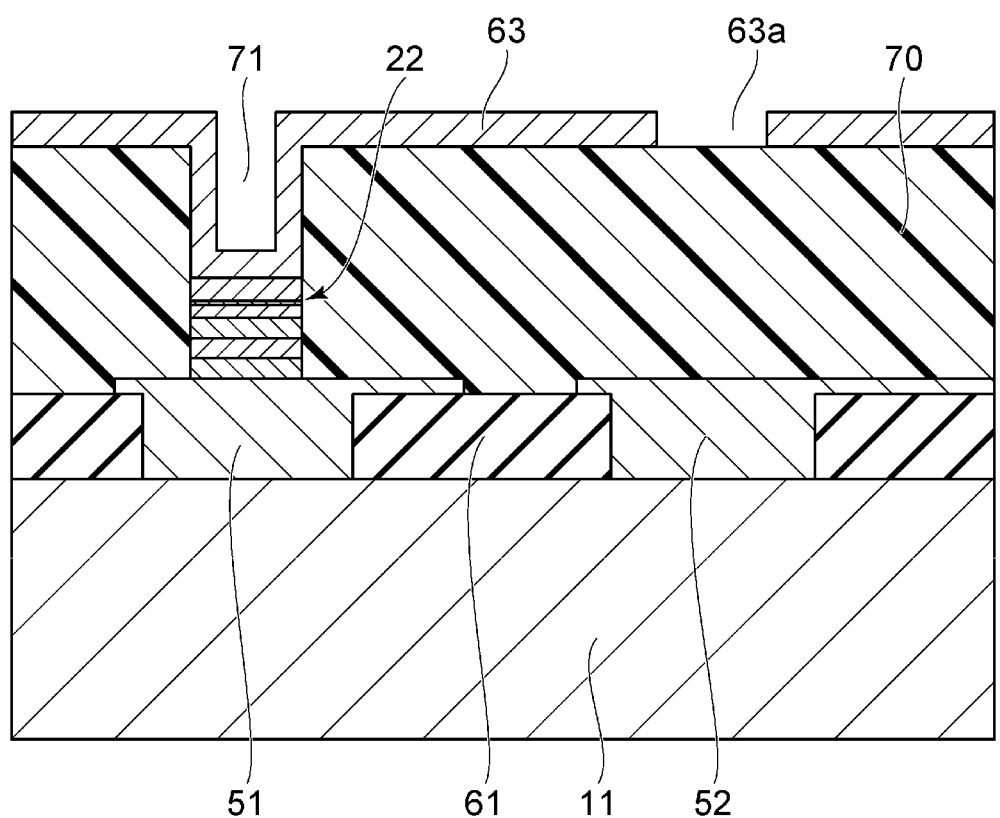

FIG. 11 is a schematic plan view illustrating positional relationships between the light-emitting portion 22, the first electrode 51, and the second electrode 52 shown in FIG. 10. In order to facilitate understanding of positional relationships between the light-emitting portion 22, the first electrode 51, and the second electrode 52, illustrations of the other members are omitted in FIG. 11. In the schematic plan view of FIG. 11, the light-emitting portion 22 is located in a region overlapping with the first electrode 51.

A resist 63 is disposed inside the recess 71 and on the upper surface of the resin layer 70 as shown in FIG. 12. The resist 63 covers the upper surface of the light-emitting portion 22 inside the recess 71. In a portion of the resist 63 on the upper surface of the resin layer 70, an opening 63a is formed in a region overlapping with the second electrode 52 in a plan view.

Figure 13:
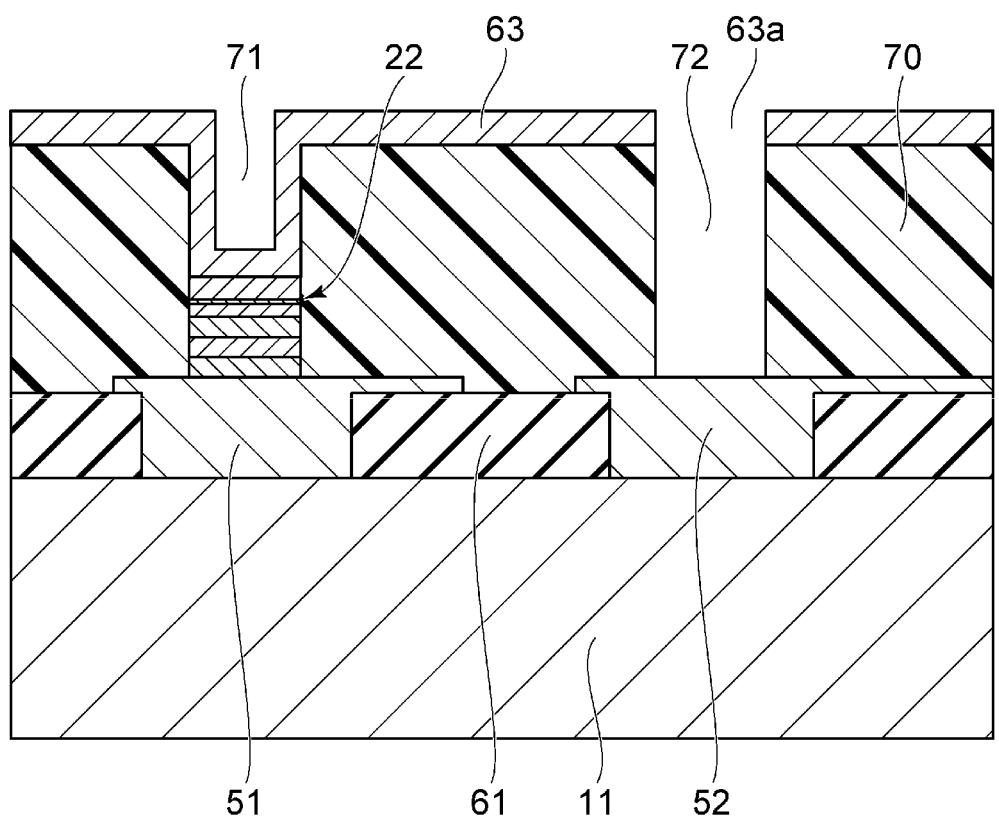
FIG. 13 is a schematic cross-sectional view illustrating a step in the method of manufacturing a light-emitting device of the embodiment of the present invention.

The resin layer 70 is etched using the resist 63 as a mask. With this operation, a portion of the resin layer 70 under the opening 63a is removed. A through hole 72 that reaches the second electrode 52 is defined in the resin layer 70 as shown in FIG. 13. The resin layer 70 is etched by, for example, RIE using a fluorine-containing gas or wet etching using an alkaline solution. Using an etching method with which the etch rate in the resin layer 70 is higher than the etch rate in the resist 63 allows for defining the through hole 72. In the case in which the etch rates of the resist 63 and the resin layer 70 are approximately equal, setting a thickness of the resist 63 such that the resist 63 remains until the through hole 72 is defined, the thickness of the resin layer 70 can be retained.

After that, the resist 63 is removed. By removing the resist 63, the upper surface of the light-emitting portion 22 is exposed from the resin layer 70 through the recess 71, and the surface of the second electrode 52 is exposed from the resin layer 70 through the through hole 72 as shown in FIG. 14.

Figure 14:
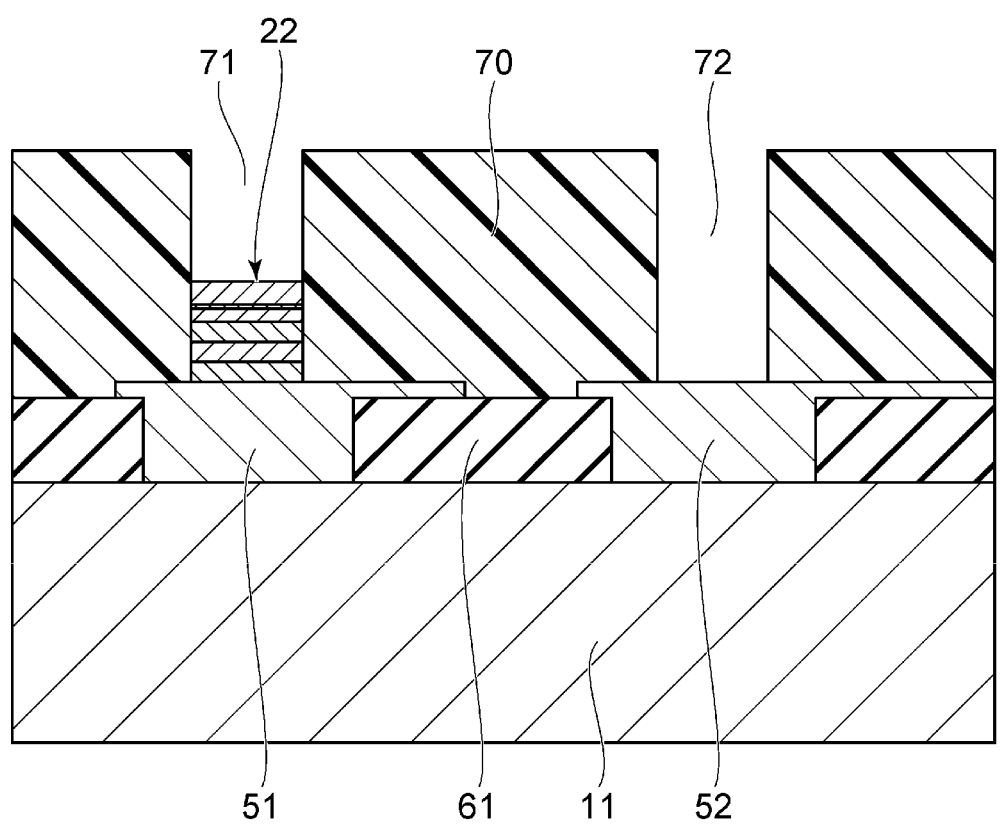
FIG. 14 is a schematic cross-sectional view illustrating a step in the method of manufacturing a light-emitting device of the embodiment of the present invention.
Figure 15:
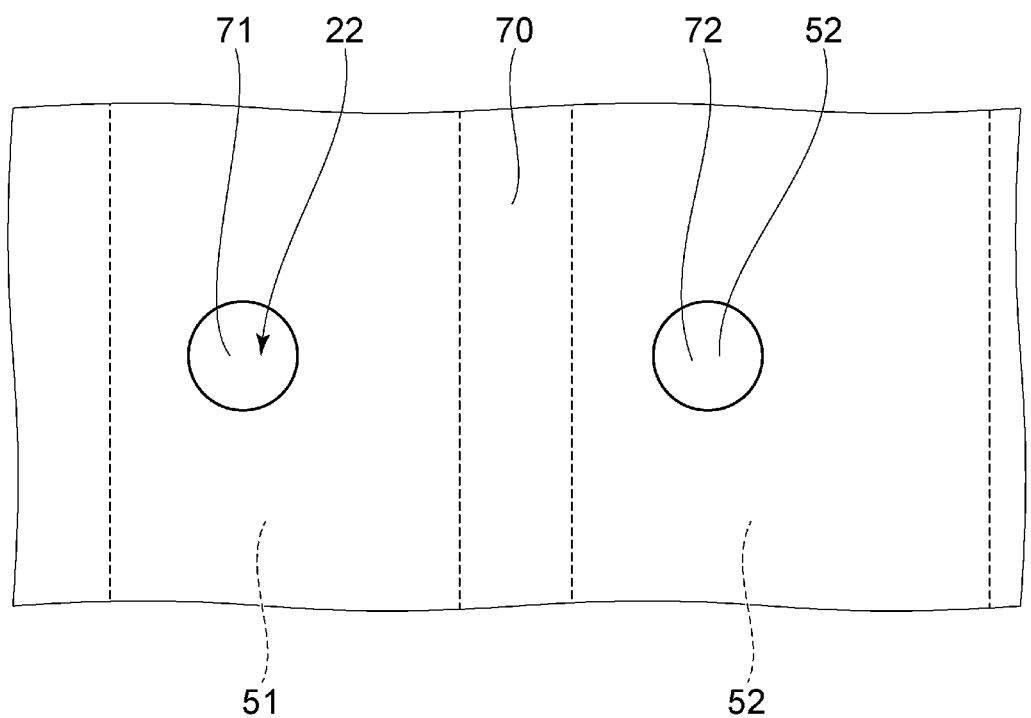
FIG. 15 is a schematic plan view illustrating positional relationships between main components in the light-emitting device of the embodiment of the present invention.

FIG. 15 is a schematic plan view illustrating positional relationships between the resin layer 70, the recess 71, the light-emitting portion 22, the first electrode 51, the through hole 72, and the second electrode 52 shown in FIG. 14. In the schematic plan view of FIG. 15, the recess 71 and the light-emitting portion 22 are located in a region overlapping with the first electrode 51, and the through hole 72 is located in a region overlapping with the second electrode 52.

Figure 16:
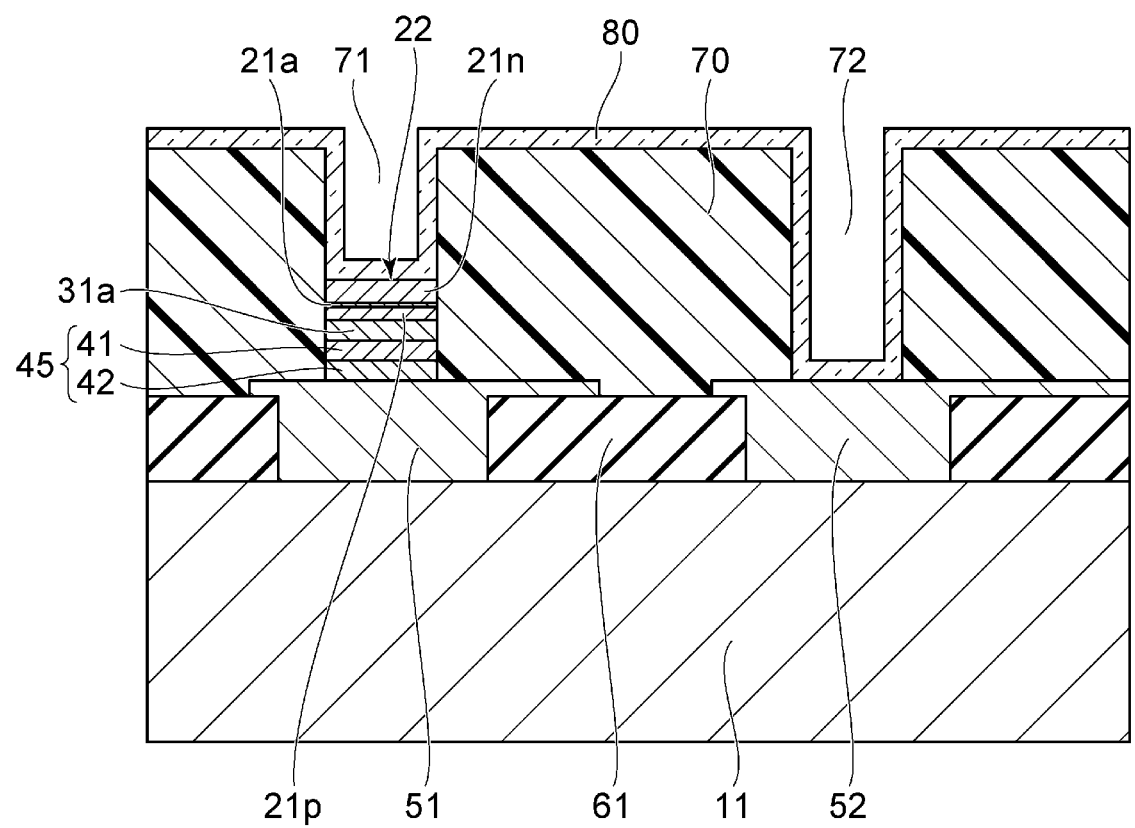
FIG. 16 is a schematic cross-sectional view illustrating a step in the method of manufacturing a light-emitting device of the embodiment of the present invention.

A light-transmissive electrically conductive film 80 is formed inside the recess 71 and the through hole 72 as shown in FIG. 16. The light-transmissive electrically conductive film 80 transmits light emitted from the light-emitting portion 22 and is, for example, an ITO film. The light-transmissive electrically conductive film 80 is disposed by, for example, sputtering.

The light-transmissive electrically conductive film 80 is in contact with the first semiconductor layer 21n of the light-emitting portion 22 at the bottom of the recess 71. The light-transmissive electrically conductive film 80 is in contact with the second electrode 52 at a surface defining a bottom of the through hole 72. The light-transmissive electrically conductive film 80 disposed on the surface defining the bottom of the recess 71 is connected to the light-transmissive electrically conductive film 80 disposed on the surface defining the bottom of the through hole 72 via the light-transmissive electrically conductive film 80 disposed on a lateral surface defining the recess 71, surfaces of the resin layer 70, and a lateral surface defining the through hole 72. Accordingly, the first semiconductor layer 21n of the light-emitting portion 22 is electrically connected to the second electrode 52 via the light-transmissive electrically conductive film 80. In the case in which the second wafer W2 does not include the second electrode 52, formation of the through hole 72 by forming the resist 63 and removing the resin layer 70 using the resist 63 as a mask is not performed. In the case in which the second wafer W2 does not include the second electrode 52, for example, an external connection electrode is formed on the surface of the light-transmissive electrically conductive film 80.

Figure 17:
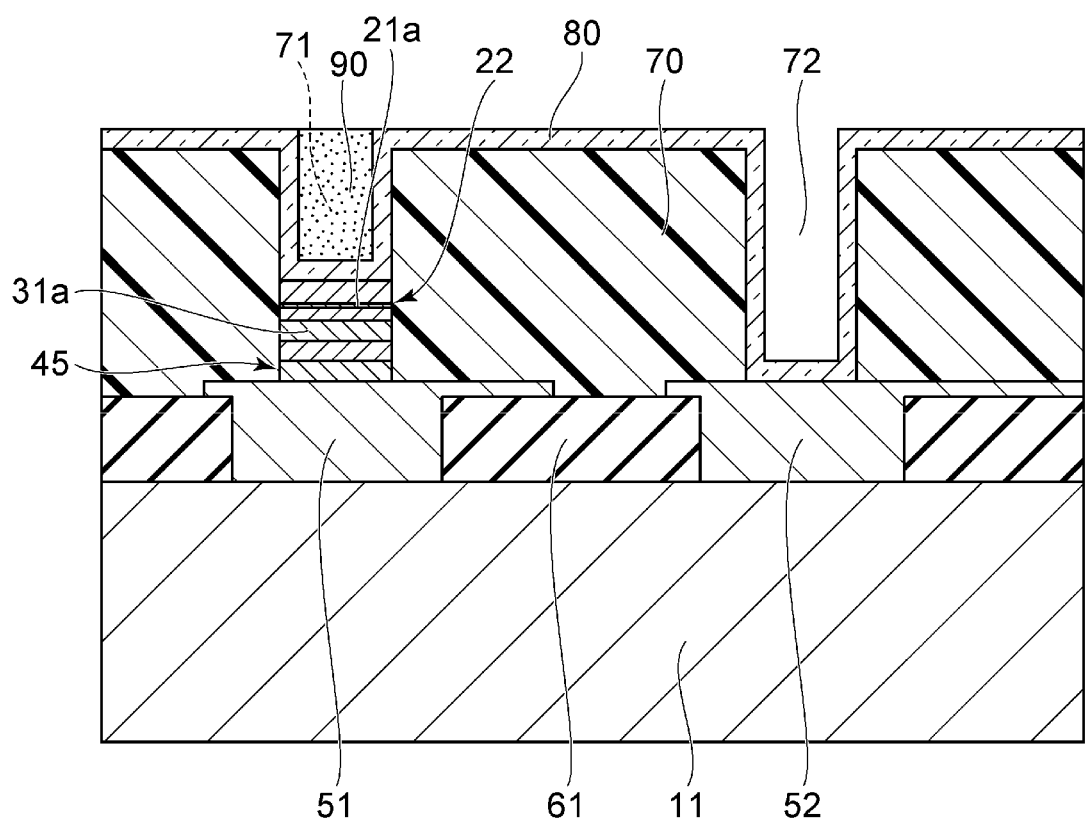
FIG. 17 is a schematic cross-sectional view illustrating a step in the method of manufacturing a light-emitting device of the embodiment of the present invention.

After that, a wavelength conversion member 90 is disposed above the light-emitting portion 22 as needed as shown in FIG. 17. The wavelength conversion member 90 contains a phosphor that is adapted to be excited by light emitted from the light-emitting layer 21a of the light-emitting portion 22 and to emit light with wavelengths different from wavelengths of light emitted from the light-emitting layer 21a.

The wavelength conversion member 90 is embedded in the recess 71 in the light-transmissive electrically conductive film 80 disposed on the light-emitting portion 22. The wavelength conversion member 90 is formed on the light-transmissive electrically conductive film 80 to fill the recess 71 by, for example, potting, electrodeposition, or application. The wavelength conversion member 90 may be formed only in the recess 71 by disposing the wavelength conversion member 90 on the light-transmissive electrically conductive film 80 and then grinding the wavelength conversion member 90. The thickness (thickness along the depth direction of the recess 71) of the wavelength conversion member 90 is, for example, 10 µm or more and 1,000 µm or less.

When a potential difference is applied between the first electrode 51 and the second electrode 52, an electric current is supplied to the light-emitting portion 22, and the light-emitting layer 21a emits light. The light-reflective resin layer 70 covers the lateral surface of the light-emitting portion 22, so that light emitted from the light-emitting layer 21a is mainly emitted directly upward. The light-emitting portion 22 can constitute, for example, a pixel of a display.

While the drawings described above show a cross section of a portion in which a single light-emitting portion 22 is formed, a plurality of light-emitting portions 22 may be formed on the substrate 11 at the same time through the steps described above.

That is, a plurality of resists 62 are disposed and the silicon substrate 10 are etched using that in the step shown in FIG. 4, and a plurality of first portions 10a are left in a region overlapping with the first electrode 51 in a plan view in the step shown in FIG. 5.

Further, the semiconductor layer 21 is etched using the first portions 10a as masks, and portions of the semiconductor layer 21 are left as a plurality of light-emitting portions 22 between the first portions 10a and the first electrode 51 in the step shown in FIG. 7.

Figure 24:
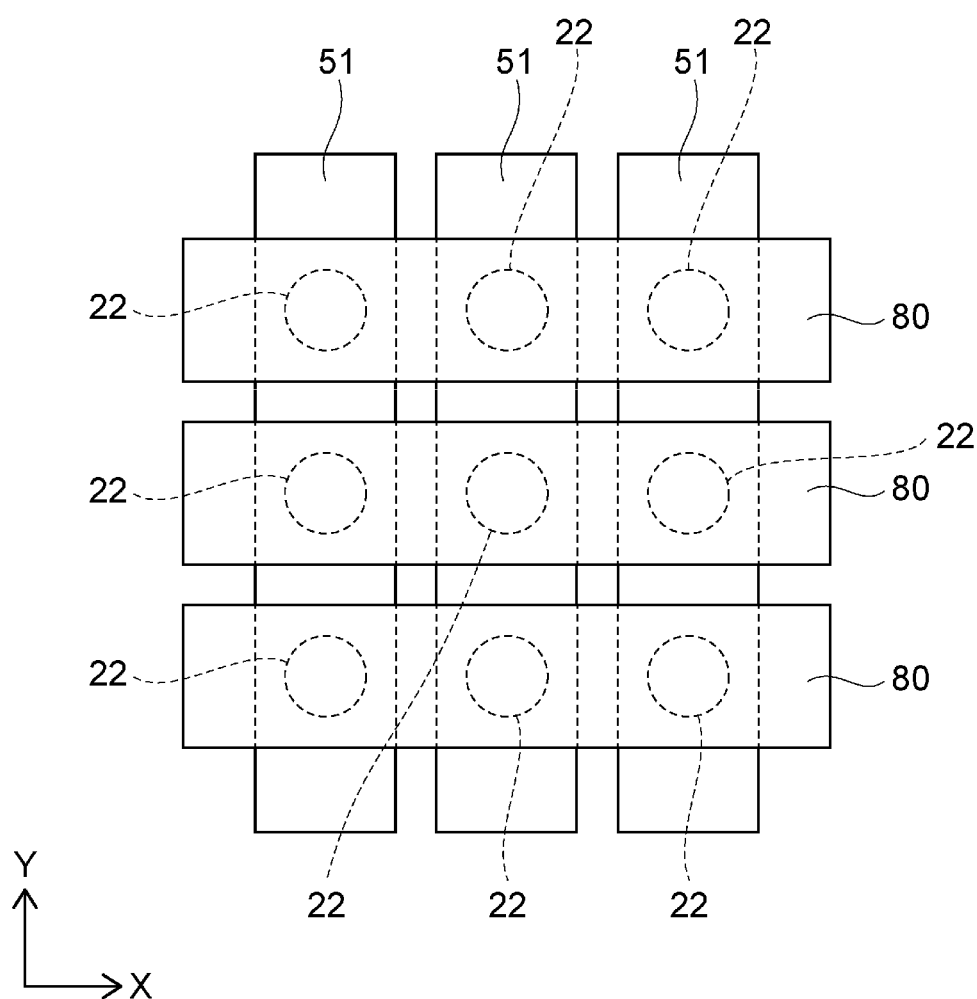
FIG. 24 is a schematic plan view illustrating positional relationships between main components in the light-emitting device of the embodiment of the present invention.

FIG. 24 is a schematic plan view illustrating positional relationships between a plurality of light-emitting portions 22, a plurality of first electrodes 51, and a plurality of light-transmissive electrically conductive films 80. In order to facilitate understanding of positional relationships between the plurality of light-emitting portions 22, the plurality of first electrodes 51, and the plurality of light-transmissive electrically conductive films 80, illustration of the other members are omitted in FIG. 24.

The plurality of light-emitting portions 22 are arranged along two directions (the X direction and the Y direction) orthogonal to each other in a plane parallel to a surface of the substrate 11. A single first electrode 51 extends in the Y' direction and is electrically connected to corresponding ones of the plurality of light-emitting portions 22 arranged in the Y direction. A single light-transmissive electrically conductive film 80 extends in the X direction and is electrically connected to corresponding ones of the plurality of light-emitting portions 22 arranged in the X direction. When any first electrode 51 and any light-transmissive electrically conductive film 80 are selected and a potential difference is applied between the selected first electrode 51 and the selected light-transmissive electrically conductive film 80, the light-emitting portions 22 connected to the pair of the selected first electrode 51 and the selected light-transmissive electrically conductive film 80 can be caused to emit light.

Figure 25:
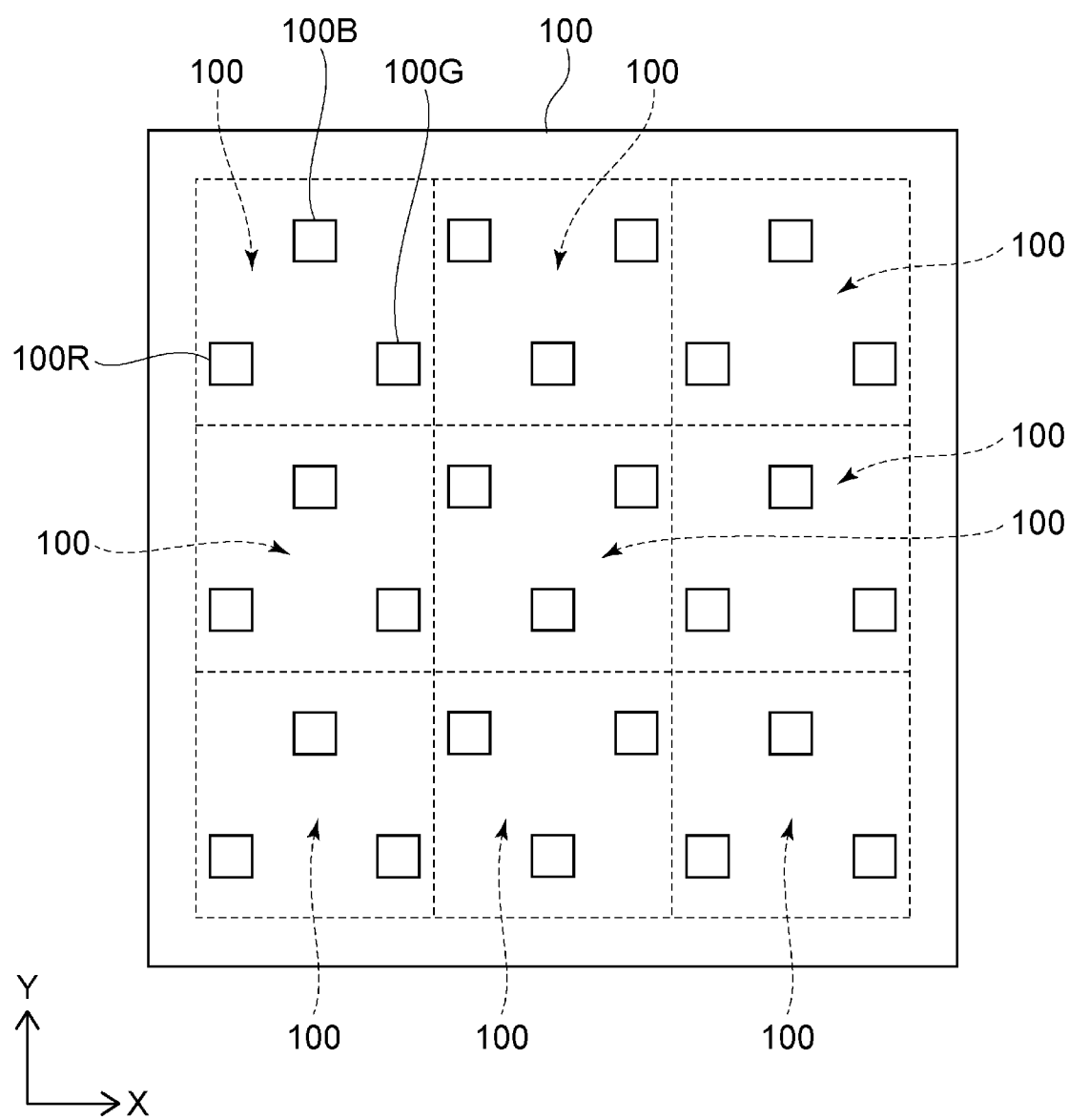
FIG. 25 is a schematic plan view illustrating positional relationships between a plurality of light-emitting elements in the light-emitting device of the embodiment of the present invention.

FIG. 25 is a schematic plan view illustrating another example of positional relationships between a plurality of light-emitting elements in the light-emitting device of the present embodiment of the present invention.

The light-emitting elements include a first light-emitting element 100R, a second light-emitting element 100G, and a third light-emitting element 100B. The first light-emitting element 100R, the second light-emitting element 100G, and the third light-emitting element 100B are configured to emit light having different colors (wavelengths). The first light-emitting element 100R is configured to emit red light, the second light-emitting element 100G is configured to emit green light, and the third light-emitting element 100B is configured to emit blue light.

The first light-emitting element 100R can be constituted of a combination of a light-emitting portion 22 configured to emit blue light and a wavelength conversion member 90 containing a red phosphor. The second light-emitting element 100G can be constituted of a combination of a light-emitting portion 22 configured to emit blue light and a wavelength conversion member 90 containing a green phosphor. The third light-emitting element 100B can be constituted of a light-emitting portion 22 configured to emit blue light. That is, the light-emitting portions 22 of the same structure configured to emit blue light can be used respectively for the light-emitting portions of the first light-emitting element 100R, the second light-emitting element 100G, and the third light-emitting element 100B. In FIG. 25, each of the first light-emitting element 100R, the second light-emitting element 100G, and the third light-emitting element 100B has a rectangular shape in a top view, and accordingly a respective one of the light-emitting portions 22 has a rectangular shape in a top view.

Alternatively, the first light-emitting element 100R can be constituted of a combination of a light-emitting portion 22 configured to emit ultraviolet light and a wavelength conversion member 90 containing a red phosphor, the second light-emitting element 100G can be constituted of a combination of a light-emitting portion 22 configured to emit ultraviolet light and a wavelength conversion member 90 containing a green phosphor, and the third light-emitting element 100B can be constituted of a combination of a light-emitting portion 22 configured to emit ultraviolet light and a wavelength conversion member 90 containing a blue phosphor. Also in this case, the light-emitting portions 22 of the same structure configured to emit ultraviolet light can be used respectively for the light-emitting portions of the first light-emitting element 100R, the second light-emitting element 100G, and the third light-emitting element 100n.

For example, at least one first light-emitting element 100R, at least one second light-emitting element 100G, and at least one third light-emitting element 100B constitute a single pixel 100 of a display. A plurality of pixels 100 are arranged along two directions (the X direction and the Y direction) orthogonal to each other in a plane parallel to the surface of the substrate 11. In a single pixel 100 in the present embodiment, two light-emitting elements are disposed on a straight line (first straight line) lying along the X direction, and the other light-emitting element is disposed on another straight line (second straight line) lying along the X direction and offset from the first straight line in the Y direction. In a pixel 100 adjacent to the pixel 100 described above in the X direction, one light-emitting element is disposed on the first straight line, and the other two light-emitting elements are disposed on the second straight line. With this arrangement of the light-emitting elements, the intervals between the light-emitting elements can be increased compared with the case in which the light-emitting elements are disposed on the same straight line lying along the X direction. This allows for margin in the design of the mask patterns used when the light-emitting portions 22 are formed.

Subsequently, a modified method of manufacturing a light-emitting device according to the present embodiment of the present invention will be described referring to FIG. 18 to FIG. 23.

Figure 18:
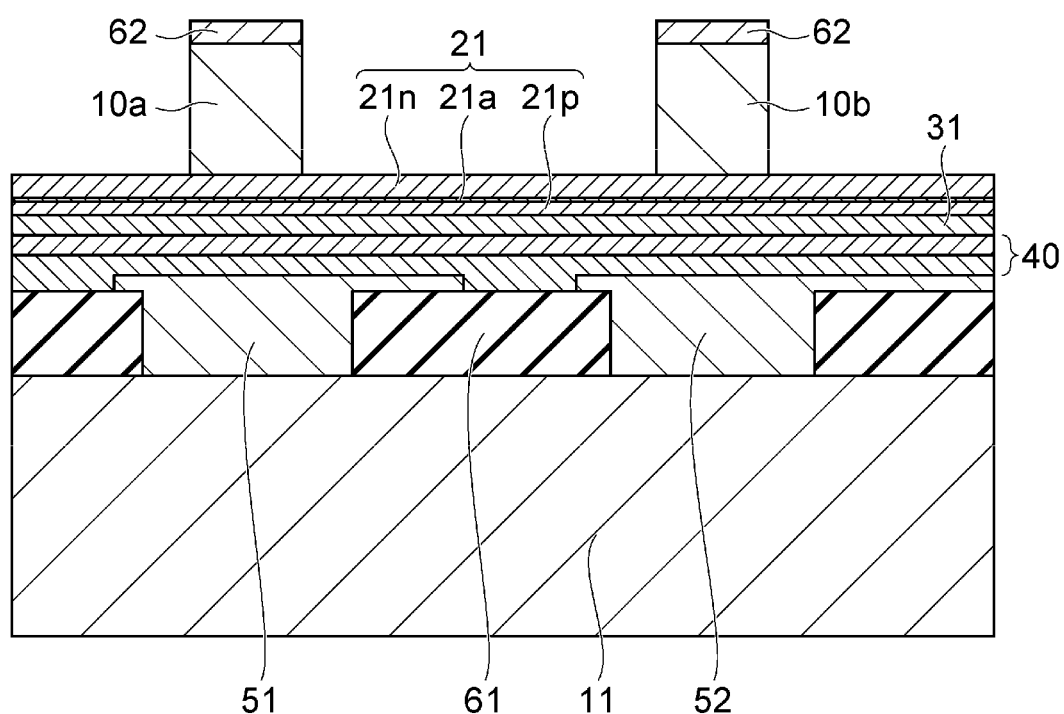
FIG. 18 is a schematic cross-sectional view illustrating a step in a modified method of manufacturing a light-emitting device of an embodiment of the present invention.

In the step of etching the silicon substrate 10 using the resist 62 as a mask described above, a second portion 10b of the silicon substrate 10 is left on the semiconductor layer 21 as shown in FIG. 18. That is, the resists 62 are formed in a region overlapping with the first electrode 51 and a region overlapping with the second electrode 52 in a plan view of the first wafer W1, and the silicon substrate 10 is then etched, so that the first portion 10a and the second portion 10b of the silicon substrate 10 are respectively left in the region overlapping with the first electrode 51 and the region overlapping with the second electrode 52 in a plan view.

The semiconductor layer 21 is then etched using the first portion 10a and the second portion 10b of the silicon substrate 10 as masks. Also, the contact layer 31 is etched using the first portion 10a and the second portion 10b as masks. Further, the bonding layer 40 is etched using the first portion 10a and the second portion 10b as masks.

Figure 19:
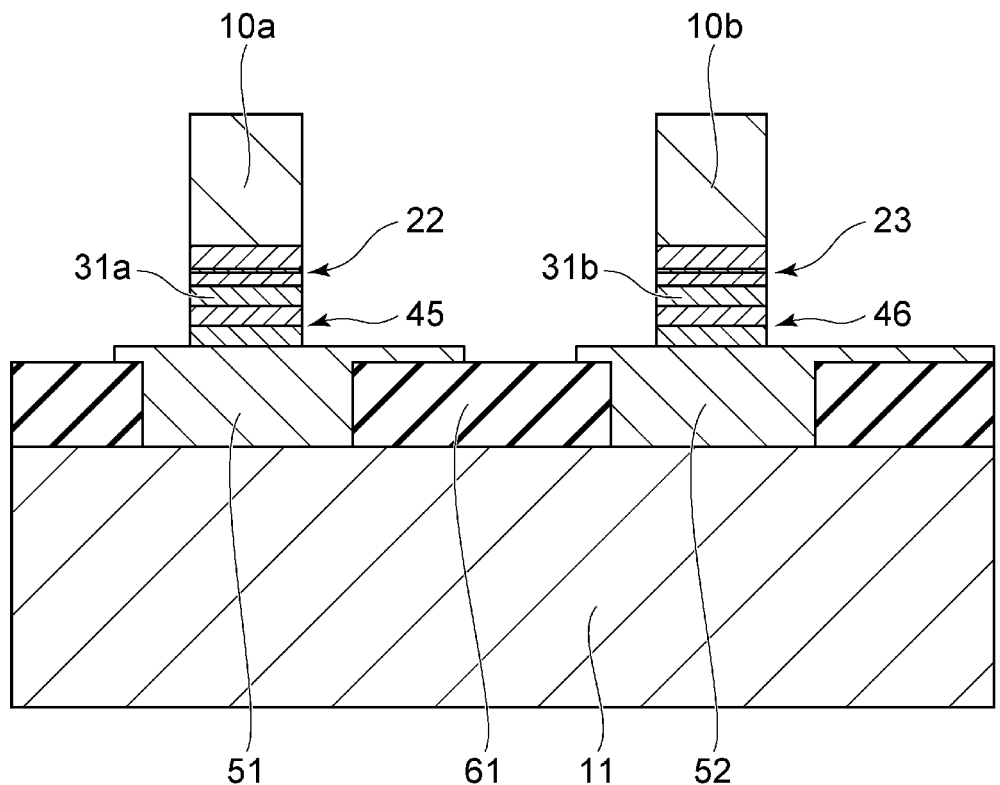
FIG. 19 is a schematic cross-sectional view illustrating a step in the modified method of manufacturing a light-emitting device of the embodiment of the present invention.

Accordingly, between the first portion 10a and the first electrode 51, a portion of the semiconductor layer 21 is left as the light-emitting portion 22, a portion of the contact layer 31 is left as the contact portion 31a, and a portion of the bonding layer 40 is left as the bonding portion 45 as shown in FIG. 19. Also, another portion (a second portion) 23 of the semiconductor layer 21, another portion 31b of the contact layer 31, and another portion 46 of the bonding layer 40 are left between the second portion 10b and the second electrode 52.

Figure 20:
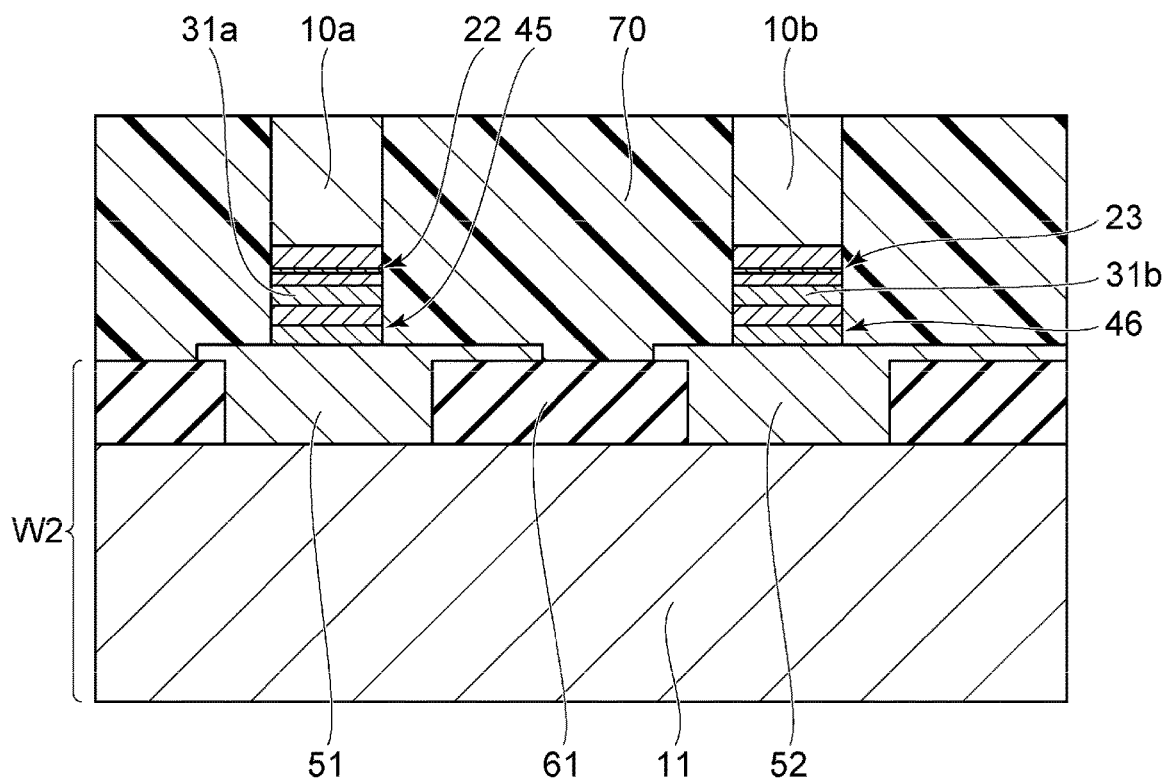
FIG. 20 is a schematic cross-sectional view illustrating a step in the modified method of manufacturing a light-emitting device of the embodiment of the present invention.

After that, the resin layer 70 is disposed on the second wafer W2 as shown in FIG. 20. The resin layer 70 covers the lateral surface of the first portion 10a of the silicon substrate 10, the lateral surface of the light-emitting portion 22, the lateral surface of the contact portion 31a, and the lateral surface of the bonding portion 45. The resin layer 70 also covers the lateral surface of the second portion 10b of the silicon substrate 10, the lateral surface of the second portion 23 of the semiconductor layer 21, the lateral surface of the other portion 31b of the contact layer 31, and the lateral surface of the other portion 46 of the bonding layer 40.

Figure 21:
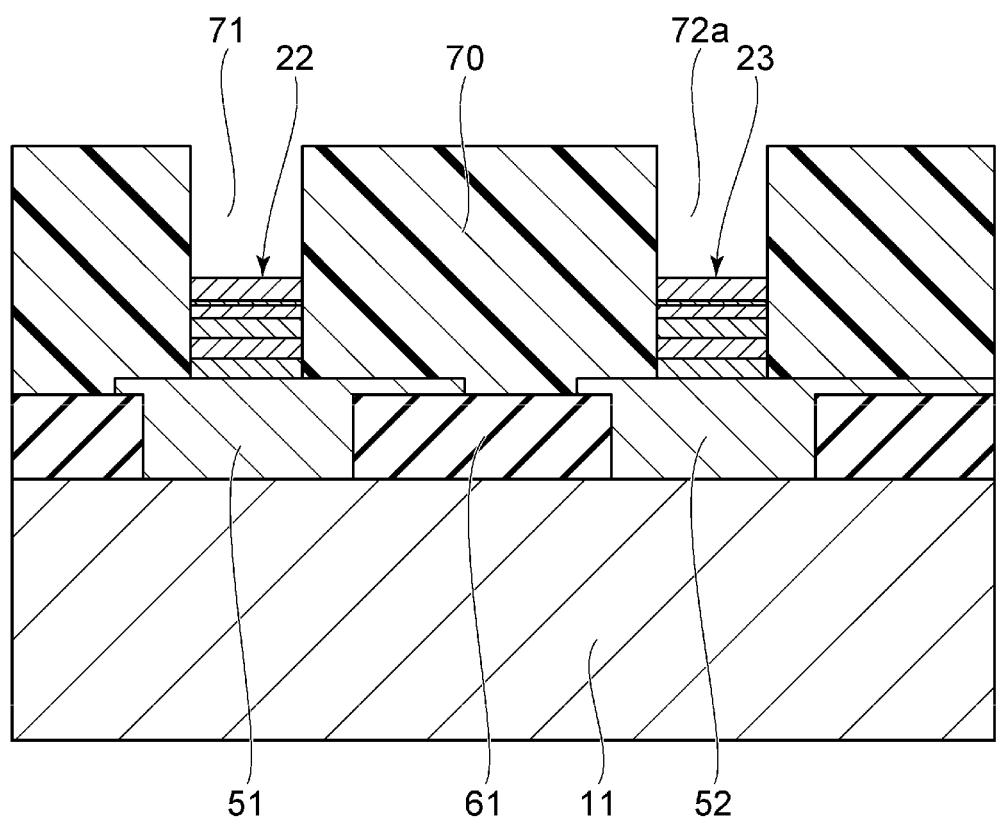
FIG. 21 is a schematic cross-sectional view illustrating a step in the modified method of manufacturing a light-emitting device of the embodiment of the present invention.

After that, the first portion 10a and the second portion 10b are removed, so that the recess 71 on the light-emitting portion 22 and a recess 72a on the second portion 23 of the semiconductor layer 21 are defined in the resin layer 70 as shown in FIG. 21. The first portion 10a and the second portion 10b are removed by, for example, RIE using a fluorine-containing gas. Using an etching method with which the etch rate of the first portion 10a and the second portion 10b is higher than the etch rate of the resin layer 70 allows for removing the first portion 10a and the second portion 10b without greatly changing the thickness of the resin layer 70. The light-emitting portion 22 and the second portion 23 of the semiconductor layer 21 are exposed from the resin layer 70.

Figure 22:
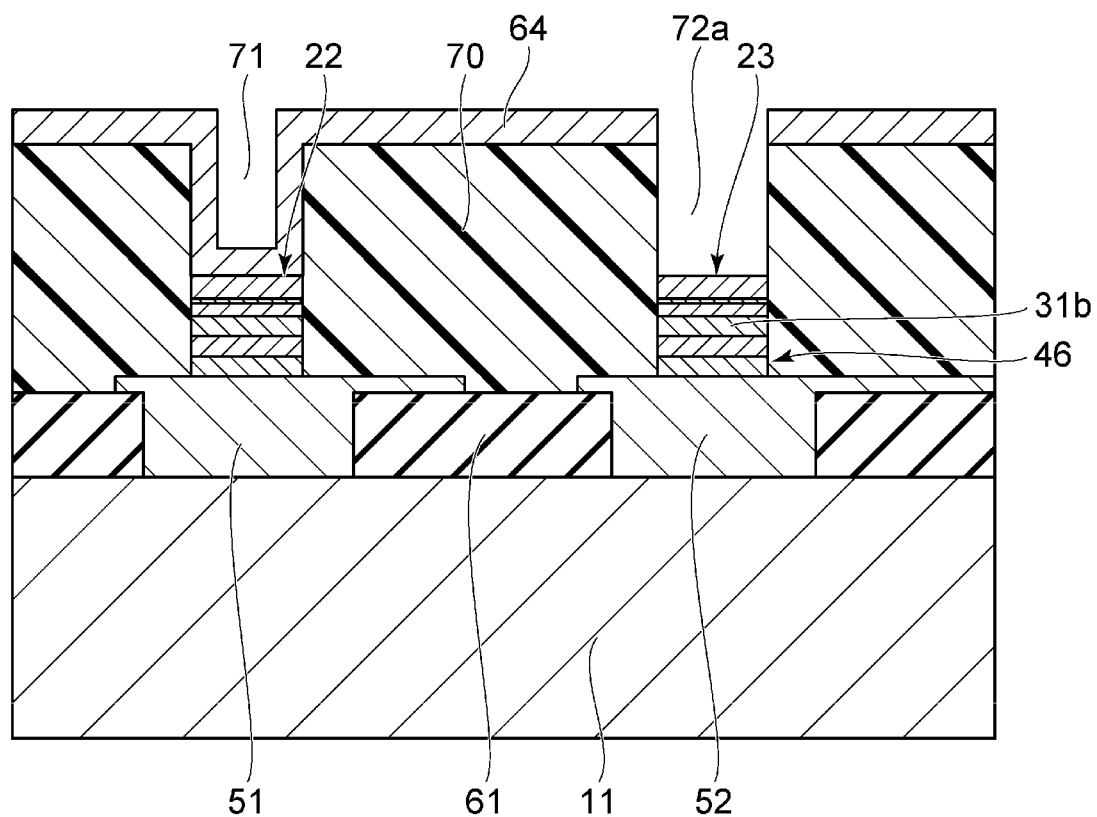
FIG. 22 is a schematic cross-sectional view illustrating a step in the modified method of manufacturing a light-emitting device of the embodiment of the present invention.
Figure 2:
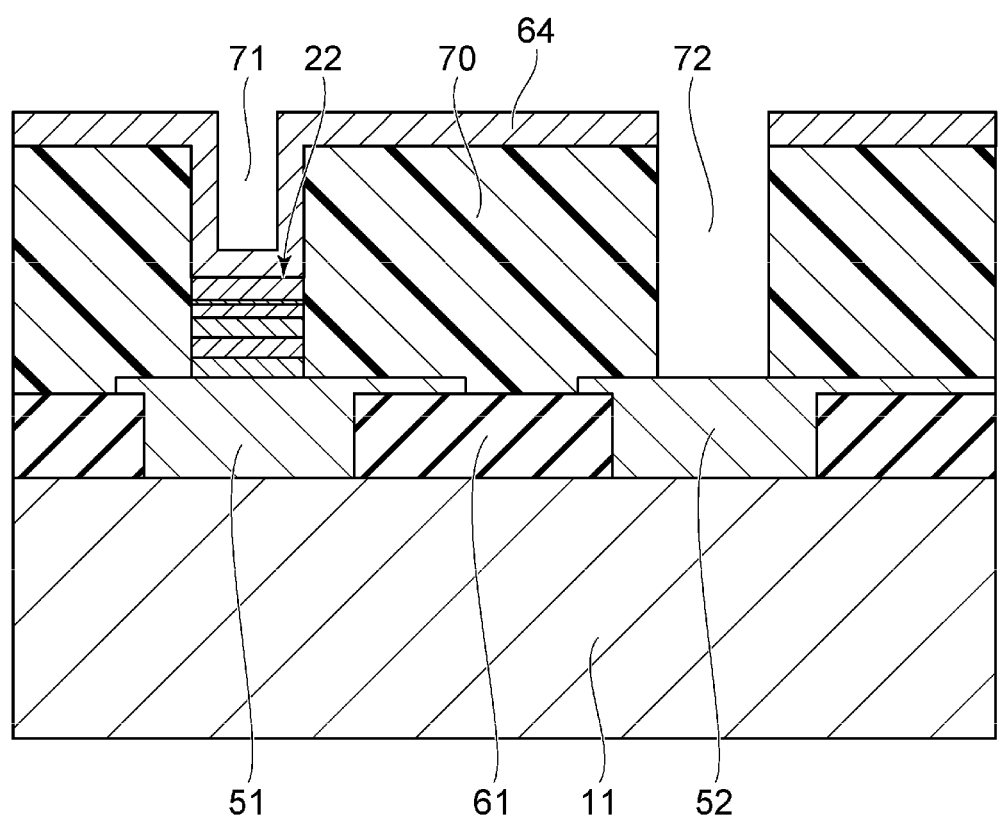

A resist 64 is disposed in the recess 71 and on the surface of the resin layer 70 as shown in FIG. 22. The resist 64 covers the upper surface of the light-emitting portion 22 inside the recess 71, while the recess 72a and the second portion 23 of the semiconductor layer 21 are exposed instead of being covered with the resist 64. The second portion 23 of the semiconductor layer 21, the other portion 31b of the contact layer 31, and the other portion 46 of the bonding layer 40 are etched using the resist 64 as a mask. The second portion 23 of the semiconductor layer 21, the other portion 31b of the contact layer 31, and the other portion 46 of the bonding layer 40 are etched using, for example, RIE technique using a chlorine-containing gas.

The through hole 72 that reaches the second electrode 52 is thus defined in the resin layer 70 as shown in FIG. 23. The step shown in FIG. 14 and subsequent steps described above are then performed. According to the another method of manufacturing a light-emitting device of the present embodiment of the present invention, etching of the resin layer 70, which tends to have a relatively large thickness, is not required in order to define the through hole 72. Therefore, the through hole 72 can be defined easily.

In the present embodiment described above, the semiconductor layer 21 is patterned on the substrate 11 after the first wafer W1 including the semiconductor layer 21 is bonded to the substrate 11, so that the light-emitting portions 22 can be disposed on the substrate 11 with higher accuracy of position than in the case in which light-emitting portions singulated from a wafer are mounted on the substrate 11. According to the present embodiment, the cost can be reduced compared with the case in which individual light-emitting portions singulated from a wafer are mounted on the substrate 11. Further, a portion (first portion 10a) of the silicon substrate 10 is used as the mask when the semiconductor layer 21 is patterned, so that the first portion 10a can be easily removed compared with the case in which, for example, a portion of a sapphire substrate is used as the mask.

Certain embodiments of the present invention have been described above referring to specific examples. However, the present invention is not limited to these specific examples. All embodiments that can be made through appropriate changes in design made by a person skilled in the art on the basis of the embodiments described above in the present disclosure are within the scope of the present invention as long as the embodiments involve the gist of the present invention. In addition, a person skilled in the art can think of various variations and modifications within the idea of the present invention. Therefore, those variations and modifications also fall within the scope of the present invention.

What is claimed is:

1. A method of manufacturing a light-emitting device, the method comprising:
    providing a first wafer, the first wafer including a silicon substrate and a semiconductor layer disposed on the silicon substrate, the semiconductor layer including a light-emitting layer;
    providing a second wafer, the second wafer including a substrate and a first electrode on or above the substrate;
    bonding a surface of the first wafer on a side having the semiconductor layer to a surface of the second wafer on a side having the first electrode to electrically connect the semiconductor layer and the first electrode;
    etching the silicon substrate such that at least one first portion of the silicon substrate remains in a region overlapping with the first electrode in a plan view;
    etching the semiconductor layer using the at least one first portion of the silicon substrate as a mask such that at least one portion of the semiconductor layer between the at least one first portion of the silicon substrate and the first electrode of the second wafer remains as at least one light-emitting portion;
    forming a resin layer to cover a lateral surface of the at least one first portion of the silicon substrate and a lateral surface of the at least one light-emitting portion with the resin layer;
    removing the at least one first portion of the silicon substrate to expose the at least one light-emitting portion; and
    after the exposing of the at least one light-emitting portion, forming a light-transmissive electrically conductive film on or above the at least one light-emitting portion.

2. The method of manufacturing a light-emitting device according to claim 1, wherein
    the bonding of the surface of the first wafer to the surface of the second wafer includes disposing an electrically conductive bonding layer between the semiconductor layer of the first wafer and the first electrode of the second wafer.

3. The method of manufacturing a light-emitting device according to claim 2, further comprising
    after the etching of the semiconductor layer, etching the electrically conductive bonding layer using the at least one first portion of the silicon substrate as a mask such that a portion of the electrically conductive bonding layer between the at least one light-emitting portion and the first electrode remains as a bonding portion.

4. The method of manufacturing a light-emitting device according to claim 1, further comprising
    forming a wavelength conversion member on or above the light-transmissive electrically conductive film.

5. The method of manufacturing a light-emitting device according to claim 2, further comprising
    forming a wavelength conversion member on or above the light-transmissive electrically conductive film.

6. The method of manufacturing a light-emitting device according to claim 3, further comprising
    forming a wavelength conversion member on or above the light-transmissive electrically conductive film.

7. The method of manufacturing a light-emitting device according to claim 1, wherein
    the providing of the second wafer includes providing the second wafer including a second electrode on or above the substrate,
    the forming of the resin layer includes forming the resin layer defining a through hole reaching the second electrode, and
    the forming of the light-transmissive electrically conductive film includes disposing the light-transmissive electrically conductive film on or above a surface of the resin layer and a lateral surface of the through hole to connect the light-transmissive electrically conductive film to the second electrode.

8. The method of manufacturing a light-emitting device according to claim 2, wherein
    the providing of the second wafer includes providing the second wafer including a second electrode on or above the substrate,
    the forming of the resin layer includes forming the resin layer defining a through hole reaching the second electrode, and
    the forming of the light-transmissive electrically conductive film includes disposing the light-transmissive electrically conductive film on or above a surface of the resin layer and a lateral surface of the through hole to connect the light-transmissive electrically conductive film to the second electrode.

9. The method of manufacturing a light-emitting device according to claim 3, wherein
    the providing of the second wafer includes providing the second wafer including a second electrode on or above the substrate,
    the forming of the resin layer includes forming the resin layer defining a through hole reaching the second electrode, and
    the forming of the light-transmissive electrically conductive film includes disposing the light-transmissive electrically conductive film on or above a surface of the resin layer and a lateral surface of the through hole to connect the light-transmissive electrically conductive film to the second electrode.

10. The method of manufacturing a light-emitting device according to claim 4, wherein
    the providing of the second wafer includes providing the second wafer including a second electrode on or above the substrate, the forming of the resin layer includes forming the resin layer defining a through hole reaching the second electrode, and the forming of the light-transmissive electrically conductive film includes disposing the light-transmissive electrically conductive film on or above a surface of the resin layer and a lateral surface of the through hole to connect the light-transmissive electrically conductive film to the second electrode.

11. The method of manufacturing a light-emitting device according to claim 5, wherein
the providing of the second wafer includes providing the second wafer including a second electrode on or above the substrate,
the forming of the resin layer includes forming the resin layer defining a through hole reaching the second electrode, and
the forming of the light-transmissive electrically conductive film includes disposing the light-transmissive electrically conductive film on or above a surface of the resin layer and a lateral surface of the through hole to connect the light-transmissive electrically conductive film to the second electrode.

12. The method of manufacturing a light-emitting device according to claim 6, wherein
the providing of the second wafer includes providing the second wafer including a second electrode on or above the substrate,
the forming of the resin layer includes forming the resin layer defining a through hole reaching the second electrode, and
the forming of the light-transmissive electrically conductive film includes disposing the light-transmissive electrically conductive film on or above a surface of the resin layer and a lateral surface of the through hole to connect the light-transmissive electrically conductive film to the second electrode.

13. The method of manufacturing a light-emitting device according to claim 7, wherein
the etching of the silicon substrate includes etching the silicon substrate such that a second portion of the silicon substrate remains in a region overlapping with the second electrode of the second wafer in a plan view,
the etching of the semiconductor layer includes etching the semiconductor layer using the second portion of the silicon substrate as a mask such that a second portion of the semiconductor layer between the second portion of the silicon substrate and the second electrode of the second wafer remains, and
the forming of the resin layer further includes
forming the resin layer to cover a lateral surface of the second portion of the silicon substrate and a lateral surface of the second portion of the semiconductor layer with the resin layer,
removing the second portion of the silicon substrate to expose the second portion of the semiconductor layer, and
removing the second portion of the semiconductor layer to define the through hole.

14. The method of manufacturing a light-emitting device according to claim 8, wherein
the etching of the silicon substrate includes etching the silicon substrate such that a second portion of the silicon substrate remains in a region overlapping with the second electrode of the second wafer in a plan view,
the etching of the semiconductor layer includes etching the semiconductor layer using the second portion of the silicon substrate as a mask such that a second portion of the semiconductor layer between the second portion of the silicon substrate and the second electrode of the second wafer remains, and
the forming of the resin layer further includes
forming the resin layer to cover a lateral surface of the second portion of the silicon substrate and a lateral surface of the second portion of the semiconductor layer with the resin layer,
removing the second portion of the silicon substrate to expose the second portion of the semiconductor layer, and
removing the second portion of the semiconductor layer to define the through hole.

15. The method of manufacturing a light-emitting device according to claim 9, wherein
the etching of the silicon substrate includes etching the silicon substrate such that a second portion of the silicon substrate remains in a region overlapping with the second electrode of the second wafer in a plan view,
the etching of the semiconductor layer includes etching the semiconductor layer using the second portion of the silicon substrate as a mask such that a second portion of the semiconductor layer between the second portion of the silicon substrate and the second electrode of the second wafer remains, and
the forming of the resin layer further includes
forming the resin layer to cover a lateral surface of the second portion of the silicon substrate and a lateral surface of the second portion of the semiconductor layer with the resin layer,
removing the second portion of the silicon substrate to expose the second portion of the semiconductor layer, and
removing the second portion of the semiconductor layer to define the through hole.

16. The method of manufacturing a light-emitting device according to claim 1, wherein
the etching of the silicon substrate further includes etching the silicon substrate such that one of the at least one first portion of the silicon substrate remains in an additional region overlapping with the first electrode in the plan view, and
the etching of the semiconductor layer further includes etching the semiconductor layer using the one of the at least one first portion of the silicon substrate as a mask such that an additional portion of the semiconductor layer between the one of the at least one first portion of the silicon substrate and the first electrode of the second wafer remains as an additional light-emitting portion.

17. The method of manufacturing a light-emitting device according to claim 16, further comprising
reducing a thickness of the silicon substrate before the etching of the silicon substrate.

18. The method of manufacturing a light-emitting device according to claim 1, further comprising
reducing a thickness of the silicon substrate before the etching of the silicon substrate.

* * * * *